United States Patent [19]

Mori et al.

[11] Patent Number: 5,294,519
[45] Date of Patent: Mar. 15, 1994

[54] PROCESS FOR PREPARING PRINTED-CIRCUIT BOARD

[75] Inventors: Kiici Mori; Kiyotake Fukawa; Tsutomu Maruyama, all of Hiratsuka, Japan

[73] Assignee: Kansai Paint Co., Ltd., Amagasaki, Japan

[21] Appl. No.: 22,755

[22] Filed: Feb. 19, 1993

Related U.S. Application Data

[63] Continuation of Ser. No. 724,817, Jul. 2, 1991, abandoned.

Foreign Application Priority Data

Jul. 5, 1990 [JP] Japan .................... 2-178359

[51] Int. Cl.$^5$ .................... G03F 7/26; C23F 11/00
[52] U.S. Cl. .................... 430/313; 430/318; 430/327; 106/14.05; 106/14.16; 106/14.18; 106/14.37; 252/390; 252/394
[58] Field of Search ............ 430/313, 314, 318, 327; 106/14.05, 14.13, 14.15, 14.16, 14.18, 14.37; 204/181.1; 252/390, 394

[56] References Cited

U.S. PATENT DOCUMENTS

| | | | |
|---|---|---|---|
| 3,492,213 | 1/1970 | Johnson | 204/181 |
| 3,497,356 | 2/1970 | Martinson | 96/86 |
| 3,554,886 | 1/1971 | Colomb, Jr. et al. | 204/159.12 |
| 3,558,741 | 1/1971 | Hotch et al. | 260/827 |
| 3,864,230 | 2/1975 | Springer et al. | 204/181 |
| 3,954,587 | 2/1976 | Kokawa | 204/181 |
| 4,024,039 | 5/1977 | Yoshida et al. | 204/181 |
| 4,040,925 | 8/1977 | McGinniss | 204/181 |
| 4,592,816 | 3/1986 | Emmons et al. | 204/180.6 |
| 4,612,049 | 9/1986 | Berner | 428/458 |
| 4,632,900 | 11/1986 | Demmer et al. | 430/323 |
| 4,673,458 | 1/1987 | Ishikawa et al. | 156/659.1 |
| 4,845,012 | 7/1989 | Seko et al. | 430/287 |
| 4,985,344 | 1/1991 | Uchino et al. | 430/325 |
| 5,134,054 | 7/1992 | Iwasawa | 430/318 |

*Primary Examiner*—Marion E. McCamish
*Assistant Examiner*—Kathleen Duda
*Attorney, Agent, or Firm*—Fisher, Christen & Sabol

[57] ABSTRACT

A process for preparing a printed circuit board. The process involves successive steps of coating a photosensitive electrodeposition coating composition onto a printed-circuit copper-clad, laminated base plate to form a photosensitive resist film, applying a pattern mask onto the photosensitive resist film, exposing to an active light, developing and etching. Also the printed-circuit copper-clad, laminated base plate is subjected to a corrosion preventing treatment after cladding or laminating and prior to the step of coating the electrodeposition coating composition thereonto with a nitrogen-containing heterocyclic compound as a corrosion inhibitor.

10 Claims, No Drawings

PROCESS FOR PREPARING PRINTED-CIRCUIT BOARD

This application is a continuation of prior U.S. patent application Ser. No. 724,817 filing date Jul. 2, 1991 now abandoned.

BACKGROUND OF THE INVENTION

(1) Field of the Invention:

This invention relates to a process for preparing a printed-circuit board, and more particularly to the improvement which comprises applying a corrosion preventing treatment with a specified corrosion inhibitor to a printed-circuit copper-clad base plate prior to subjecting the printed-circuit copper-clad base plate to an electrodeposition coating, resulting in preventing the eluation of copper from the printed-circuit copper-clad base plate upon effecting the electrodeposition coating, thereby preventing such phenomena as incomplete developing onto the printed-circuit board, with the further results of completely protecting the corners and interior of through-holes, and preparing a precise printed-circuit board.

(2) Description of the Prior Art:

The process for preparing a printed-circuit board, which comprises coating a photosensitive electrodeposition coating composition onto a printed-circuit base plate, is known (see, for example, U.S. Pat. Nos. 3954587, 4592816, 4632900 and 4673458; Japanese Patent Application Laid-Open Nos. 207139/85, 206293/86 and 6070/88, etc.).

The process for preparing a printed-circuit board according to the electrodeposition coating process has such advantages that automation is made possible, that a uniform film is obtained and so forth, and it is an industrially advantageous process. However, corrosion of the printed-circuit base plate at the time of carrying out the electrodeposition coating cause abnormal depositing of the film onto the corroded area or the failure of forming the film onto the corroded area, resulting in abnormal phenomena which may take place at the time of developing. Particularly, in the case of preparing a precise pattern, various phenomena such as disconnection, deficiency of pattern, shortcircuiting and the like may take place, resulting in defective printed-circuit boards.

SUMMARY OF THE INVENTION

It is an object of the present invention to provide an improved process for preparing a printed-circuit board, which is capable of preventing the corrosion and oxidation of the printed-circuit copper-clad, laminated base plate, which results in obtaining a non-defective photosensitive resist film free of defects such as pinholes and craters, obtaining a printed-circuit copper-clad, laminated base plate (hereinafter may be referred to as a base plate) having excellent developing stability, and in obtaining a non-defective and precise printed circuit board free of defects such as pinholes, partial deficiency in the corners of through-holes after etching, and so forth.

It is another object of the present invention to provide an improved process for preparing a printed circuit board, which is capable of preventing eluation of copper from the base plate and such phenomena as incomplete developing of the printed-circuit board, and protecting the corners and interior of through-holes in order to obtain a precise printed-circuit board.

It is another object of the present invention to provide a process for preparing a printed-circuit board which is capable of remarkably improving such phenomena as abnormal deposit of the resist film during the electrodeposition coating, incomplete developing and the like, minimizing the disconnection, deficiency, shortcircuiting, etc. of the pattern, and remarkably improving defects of the pattern.

That is, the present invention provides an improved process for preparing a printed circuit board, which comprises successive steps of coating a photosensitive electrodeposition coating composition onto a printed-circuit copper-clad, laminated base plate to form a photosensitive resist film, applying a pattern mask onto the photosensitive resist film, exposure to an active radiation, and developing and etching. The improvement further comprises a step of subjecting the printed-circuit copper-clad, laminated base plate to a corrosion preventing treatment after cladding or laminating and prior to the step of coating the electrodeposition coating composition thereonto with at least one of the nitrogen-containing heterocyclic compounds selected from a group consisting of the compounds represented by the following general formulas (A)–(D):

(A)

wherein $R_1$ and $R_2$ represent hydrogen atom or an alkyl group having 1–6 carbon atoms respectively;

(B)

wherein $R_3$ and $R_4$ represent hydrogen atom, hydroxyl group or an alkyl group having 1–6 carbon atoms respectively;

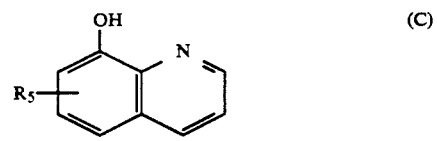

(C)

wherein $R_5$ represents hydrogen atom, chlorine atom or an alkyl group having 1–6 carbon atoms; and

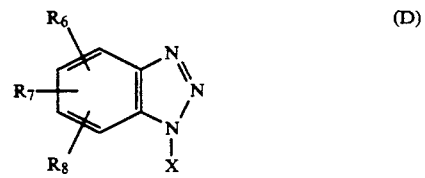

(D)

where X represents hydrogen atom or hydroxyl group, and $R_6$, $R_7$ and $R_8$ represent hydrogen atom, chlorine atom or an alkyl group having 1–6 carbon atoms respectively.

The present invention makes it possible to provide an improved process for preparing the printed-circuit board which is capable of remarkably improving such phenomena as abnormal deposit of the resist film during the electrodeposition coating, incomplete developing and the like, minimizing the disconnection, deficiency, shortcircuiting, etc. of the pattern, and remarkably improving defects of the pattern compared with the case where the base plate is not subjected to the corrosion preventing treatment.

DETAILED DESCRIPTION OF THE INVENTION

According to the process of the present invention, the base plate is subjected to the corrosion preventing treatment prior to coating the electrodeposition coating composition thereonto with the compounds represented by the above general formulas (A)–(D), i.e. the nitrogen-containing heterocyclic compounds as corrosion inhibitors. Examples of the nitrogen-containing heterocyclic compound may include the following ones.

Examples of the compounds of the general formula (A) may include imidazole, 2-methylimidazole, 2-ethylimidazole, 4-methylimidazole, 2-ethyl-4-methylimidazole and the like.

Examples of the compounds by the general formula (B) may include pyrazole, 5-oxypyrazole or pyrazolone, 3-methylpyrazole, 5-methylpyrazole, 3,5-dimethylpyrazole, 3-methyl-5-oxypyrazole and the like.

Examples of the compounds of the general formula (C) may include 3-quinolinol, 5-chloro-8-quinolinol, 5-methyl-8-quinolinol, 7-ethyl-8-quinolinol and the like.

Examples of the compounds of the general formula (D) may include benzotriazole, 1-hydroxybenzotriazole, 5,6-dimethylbenzotriazole, 5-chlorobenzotriazole and the like.

The above compounds may be used alone or in combination respectively. The above nitrogen-containing heterocyclic compounds may also be used in the form of their salts with an inorganic acid such as hydrochloric acid, sulfuric acid, nitric acid or the like, or with an organic acid such as acetic acid, succinic acid, maleic acid, fumaric acid or the like.

The corrosion preventing treatment of the base plate with the above nitrogen-containing heterocyclic compounds may usually be carried out by a method of dipping the base plate immediately after cladding or after laminating into an aqueous solution or an organic solvent solution of the above compounds or of coating a solution of the above compounds onto the base plate by the conventional coating method such as spray coating, curtain flow coating or the like, followed by washing or air blow, and by drying.

The organic solvent used in the preparation of the organic solvent solution of the above heterocyclic compounds is not specifically limited and may be selected depending on the kind of the heterocyclic compound, but preferably selected from ones suitable for washing and/or drying after coating. The concentration of the above solutions of the heterocyclic compound is not strictly limited and may be varied depending on the kind of the solution, but will normally be in the range of 0.01 to 10 percent by weight, preferably 0.05 to 5 percent by weight. When the concentration is less than 0.01 percent by weight, the corrosion preventing treatment may become unsatisfactory, and when more than 10 percent by weight, the electrodeposition coating may become unstable.

The photosensitive electrodeposition coating composition used for the electrodeposition coating after the corrosion preventing treatment of the base plate in the present invention is basically a composition containing, as a major component, a resin having a photosensitive group and a salt-forming group to make water-soluble or water-dispersible, and may be classified into a negative electrodeposition coating composition and a positive electrodeposition coating composition. Typical examples of the electrodeposition coating composition are explained below.

NEGATIVE ELECTRODEPOSITION COATING COMPOSITION

The negative electrodeposition coating composition may include the conventional anionic or cationic electrodeposition coating composition which contains a water-soluble or water-dispersible, polymerizable unsaturated resin and a photopolymerization initiator as the major components. The polymerizable unsaturated resin used in the above coating composition can not specifically be limited so long as it is a water-soluble or water-dispersible resin containing an anionic or cationic group.

The typical examples of the polymerizable unsaturated resin include (1) a polymerizable unsaturated resin prepared by addition of a reaction product of a compound having a polymerizable unsaturated bond and hydroxyl group in one molecule with a diisocyanate compound to a high acid value acrylic resin having hydroxyl group on the skeleton; (2) a mixture of a polymerizable unsaturated resin prepared by addition of $\alpha,\beta$-ethylenically unsaturated dibasic acid or an anhydride thereof to an unsaturated bond in the aliphatic acid chain of an esterification product between an epoxy resin having epoxy group and unsaturated fatty acid with an ethylenically unsaturated compound having one or more of a polymerizable unsaturated bond in one molecule; (3) a polymerizable unsaturated resin prepared by addition of a compound having a polymerizable unsaturated bond and glycidyl group in one molecule to a high acid value acrylic resin or a mixture of the above polymerizable unsaturated resin with an ethylenically unsaturated compound having one or more of a polymerizable unsaturated bond in one molecule; and may also include unsaturated, modified polybutadiene and the like.

The typical examples of the cationic resin may include (4) a polymerizable unsaturated resin prepared by the addition of a reaction product between a compound having an unsaturated bond and hydroxyl group in one molecule and a diisocyanate compound to an acrylic resin having hydroxyl group and tertiary amino group in the resin skeleton; (5) a tertiary amino group-containing unsaturated resin prepared by reacting a resin obtained by copolymerizing a compound having a polymerizable unsaturated bond and glycidyl group in one molecule, for example, glycidyl(meth)acrylate, a compound having a polymerizable unsaturated bond and tertiary amino group in one molecule, for example, N,N-dimethylaminoethyl (meth)acrylate, N,N-diethylaminoethyl (meth)acrylate and N,N-dimethylaminopropyl (meth)acrylate and other polymerizable monomer with monocarboxylic acid having polymerizable unsaturated bond, for example, (meth)acrylic acid or with a compound having a polymerizable unsaturated bond and hydroxyl group in one molecule; and (6) an onium salt group-containing unsaturated resin obtained by reacting a part of epoxy groups in epoxy resin with a compound having a polymerizable unsaturated group and carboxyl group or hydroxyl group in one molecule, followed by forming an onium salt of the remaining epoxy groups with a tertiary amino compound, thioether, phosphine, etc. and with carboxylic acid; and the like.

The above resins may be used alone or in combination respectively.

Advantageously, the anionic or cationic polymerizable unsaturated resins (1)–(6) as above may contain a carboxyl group in such an amount as to have an acid value of 20 to 300, preferably 70 to 110 in the case of the anionic resins (1)–(3), and may have a tertiary amino group and/or onium salt group content of 0.2 to 5 moles, preferably 0.3 to 2.0 moles per 1 kg of the resin in the case of the cationic resins (4)–(6), an unsaturation equivalent of 150 to 3,000, preferably 150 to 1,000, and a number average molecular weight of 300 or more, preferably 1,000 to 30,000.

Advantageously, the polymerizable unsaturated resin, prior to being exposed to actinic radiation, has a glass transition temperature (hereinafter may be referred to as Tg) of −50° to 60° C., preferably −20° to 40° C. When the Tg is −50° C. or lower, the coating film at the time of electrodeposition coating is so soft that the film resistance may be reduced, making it difficult to obtain a uniform coating film. On the other hand, when the Tg is 60° C. or higher, the film resistance may be increased, resulting in making it difficult to obtain a thick film, making it difficult for a chain transfer reaction to take place when exposed to actinic radiation and making photosensitivity poor, and so forth.

The photopolymerization initiator used in combination with the unsaturated resin in the present invention is not specifically limited so long as it is capable of initiating the radical polymerization with an actinic radiation such as ultraviolet light.

Typical examples of the photopolymerization initiator incorporated in the photographic negative type photo-curable electrodeposition coating composition may include benzoin, benzoin methyl ether, benzoin ethyl ether, benzyl, diphenyl disulfide, tetramethylthiuram monosulfide, diacetyl, Eosine, Thionine, Michler's ketone, anthraquinone, chloroanthraquinone, methyl anthraquinone, α-hydroxyisobutylphenone, p-isopropyl-α-hydroxyisobutylphenone, α,α′-dichloro-4-phenoxyacetophenone, 1-hydroxy-1-cyclohexylacetophenone, 2,2-dimethoxy-2-phenylacetophenone, methylbenzoyl formate, 2-methyl-1-[4-(methylthio)-phenyl]-2-morpholinopropane, thioxanthone, benzophenone, and the like. The above photopolymerization initiator may be used in an amount of 0.1 to 10 parts by weight per 100 parts by weight of the resin component (as solids). When the above amount is less than 0.1 part by weight, curing properties may become poor, and when more than 10 parts by weight, the mechanical strength of the cured film may become poor.

POSITIVE ELECTRODEPOSITION COATING COMPOSITION

The positive electrodeposition coating composition used for forming the positive photoresist in the present invention may include the conventionally known ones containing, as the major component, a resin having a salt-forming group for making water-soluble or water-dispersible and a photosensitive group, for example, benzoquinonediazido or naphthoquinonediazido unit, and may be of the anionic or cationic type [see, for example, Japanese Patent Application Laid-Open Nos. 207139/85, 206293/86, 6070/88, 4671/89 (Japanese Patent Application No. 157841/87), 4672/89 (Japanese Patent Application No. 157842/87), 90270/89 (Japanese Patent Application No. 245840/87), and 121375/89 (Japanese Patent Application No. 279288/87), and the like].

The resin used in the above positive electrodeposition coating composition with the salt-forming group and photosensitive group is the same as the above representative unsaturated resins (1)–(6) so far as the acid value, the amount of the tertiary amino group and/or onium salt group, the number average molecular weight and Tg are concerned except that it contains the photosensitive group such as benzo (or naphtho) quinone diazido unit in an amount of 5–60 percent by weight, preferably 10–50 percent by weight on the basis of the weight of the resin.

The water-solubilization or water-dispersibilization of the resin for preparing the electrodeposition coating composition is carried out, in the case where an acid group such as a carboxyl group is introduced into a resin skeleton, by neutralizing the acid group with an alkali as a neutralizing agent or, in the case where an amino group is introduced thereinto, by neutralizing the amino group with an acid as a neutralizing agent.

A copper-clad laminated plate as a base plate, which has been subjected to the corrosion preventing treatment with the nitrogen-containing heterocyclic compound selected from the above compounds (A)–(D), is dipped into an electrodeposition coating bath which comprises electrodeposition coating composition obtained as explained above to which is usually applied a direct current under 20–400 V for coating. The base plate is used as an anode for the anionic type electrodeposition coating, and is used as a cathode for the cationic type electrodeposition coating. The direct current is applied normally, for about 15 seconds to about 5 minutes. A coated film thickness is about 5 to about 60 μm, preferably 10–30 μm. The above application of the direct current is followed by washing with water, and an air blow.

The corrosion preventing treatment of the base plate prior to the electrodeposition coating in the present invention is very effective for carrying out a stable electrodeposition coating. The corrosion inhibitor used in the corrosion preventing treatment may form a chelate compound with the copper of the base plate, and the treatment of the base plate with the corrosion inhibitor makes it possible to control an interfacial abnormal reaction and to control the elution of copper into the coated film in the case of the anionic electrodeposition coating, with the results that neither the phenomena of the incomplete developing due to partial and abnormal deposit of copper nor the development of partial and abnormal current on the electrodeposition coating take place, with the result that the development of pinholes due to generation of gas is also controlled.

Thereafter, a pattern mask is applied onto a photosensitive electrodeposition coating film formed on the base plate to be exposed to an actinic radiation such as ultraviolet light.

The actinic radiation is irradiated onto an area to be a conductor circuit when the photosensitive electrodeposition coating film is of a negative type, and onto unnecessary areas other than the conductor circuit only when the photosensitive electrodeposition coating film is of a positive type.

The actinic radiation used in exposure actinic radiation according to the present invention may desirably be one having a wave length of 3,000–4,500 Å. Examples of the light sources of the above actinic radiation may include sun light, mercury lamp, xenon lamp, arc lamp, laser beam and the like. Examples of the mercury lamp may include high pressure mercury lamp, ultra-high pressure mercury lamp, metal halide lamp, chemical lamp and the like. Curing of, the coating film by irradiation of the actinic radiation is effected within several minutes, normally in the range of one second to 20 minutes.

The developing treatment may be carried out, when the electrodeposition coating composition is of the anionic type, by spraying an aqueous weak alkali solution onto the surface of the coated film, when the electrodeposition coating composition is of the cationic, by spraying an aqueous acid solution having a pH of 5 or less thereonto to wash away an uncured area of the coated film.

The aqueous weak alkali, which is capable of neutralizing a free carboxylic acid contained in the film to make water-soluble, may include, for example, an aqueous sodium hydroxide, sodium carbonate, potassium hydroxide, ammonia, amine, sodium silicate and the like. In the case where the negative type is used, the non-exposed area is washed away, and in the case where the positive type is used, the exposed area is washed away.

In the case where the coated film is of the positive type, the coated film may be subjected to a heating treatment at a surface temperature of 100° to 180° C., preferably 120° to 160° C. for one second to 30 minutes prior to being subjected to developing, because the above heating treatment may promote the insolubilization of the non-exposed area to the alkali and may further improve the resolving property of the pattern.

In the case where the cationic electrodeposition coating is carried out, the developing treatment is carried out by spraying an aqueous weak acid or by dipping into the aqueous weak acid to wash away an uncured area for the negative type or an exposed, reacted area for the positive type. The aqueous weak acid, which is capable of neutralizing a free amino group in the film to make water-soluble, may include, for example, hydrochloric acid, sulfuric acid, phosphoric acid, acetic acid, formic acid, lactic acid and the like. It is also possible to carry out the above developing treatment by use of a solvent.

After the completion of the developing treatment, the non-circuit area deposited on the base plate and composed of copper foil is removed by use of a ferric chloride solution, cupric chloride solution, etc., for example, for the anionic type, or by use of an alkaline solution, etc. for the cationic type according to the conventional etching treatment. Thereafter, the photo-cured film or unexposed film on the circuit pattern may be dissolved for removing in a cellosolve solvent such as ethyl cellosolve, ethyl cellosolve acetate and the like; an aromatic hydrocarbon solvent such as toluene, xylene and the like; a ketone solvent such as methyl ethyl ketone, methyl isobutyl ketone and the like; acetate solvent such as ethyl acetate, butyl acetate and the like; chlorinated solvent such as trichloroethylene; or an aqueous alkali solution such as a 2–10 percent aqueous sodium hydroxide or potassium hydroxide solution when the anionic electrodeposition coating composition is used, or an aqueous acid solution when the cationic electrodeposition coating composition is used, to form a printed-circuit on the base plate.

The present invention provides an improved process for preparing a printed-circuit board, which is capable of preventing the corrosion and oxidation of the printed-circuit copper-clad, laminated base plate, which results in obtaining a non-defective photosensitive resist film free of defects such as pinholes and craters, obtaining a base plate which has excellent developing stability, and in obtaining a non-defective and precise printed circuit board free of defects such as pinholes, partial deficiency in the corners of through-holes after etching, and so forth.

The present invention provides an improved process for preparing a printed circuit board, which is capable of preventing eluation of copper from the base plate and such phenomena as incomplete developing of the printed-circuit board, and is capable of protecting the corners and interior of through-holes for obtaining a precise printed-circuit board.

The present invention provides an improved process for preparing a printed-circuit board which is capable of remarkably improving such phenomena as abnormal deposit of the resist film during the electrodeposition coating, incomplete developing and the like, minimizing the disconnection, deficiency, shortcircuiting, etc. of the pattern, and remarkably improving defects of the pattern.

The present invention is explained more in detail by the following examples, in which "part" and "%" represent "part by weight" and "% by weight" respectively.

EXAMPLE 1

A mixture of 400 parts of methyl methacrylate, 400 parts of butyl acrylate, 200 parts of acrylic acid and 20 parts of azobisisobutyronitrile is dropped over 3 hours into 900 parts of propylene glycol monomethyl ether as a hydrophilic solvent at 110° C. under an atmosphere of nitrogen gas. The completion of the above dropping is followed by one hour's maturing, and a mixture of 10 parts of azobisdimethylvaleronitrile and 100 parts of propylene glycol monomethyl ether is dropped over one hour, followed by 5 hours' maturing to obtain a solution of a high acid value acrylic resin having an acid value of 155. Thereafter, to the above solution are added 240 parts of glycidyl methacrylate, 1.2 parts of hydroquinone and 6 parts of tetraethylammonium bromide, followed by reacting for 5 hours at 110° C. blowing air thereinto to obtain an unsaturated resin solution having an acid value of about 50, a degree of unsaturation of 1.35 moles/kg.

To 2270 parts of the above unsaturated resin solution is added 67 parts of triethylamine to be sufficiently neutralized, followed by adding 60 parts of α-hydroxyisobutylphenone as a photopolymerization initiator to be mixed, and by adding deionized water in such an amount as to obtain an electrodeposition coating bath (pH: 6.7) having a solids content of 15%.

Thereafter, a copper-clad base plate, the interior of through-holes of which has been copper-cladded to a thickness of about 25 μm, is dipped into a 0.5% aqueous imidazole solution at room temperature for 30 seconds and is then taken out, followed by air blow drying.

The electrodeposition coating is carried out by use of the above electrodeposition coating bath under such conditions that the copper-clad base plate, which has been subjected to the corrosion preventing treatment, is used as an anode, that an application of current is carried out at a bath temperature of 25° C., in which a current density is linearly increased to 60 mA/dm² in 10 seconds from a starting of the application of current and a current is then applied for 3 minutes under the resulting current density of 60 mA/dm², and that the resulting film is washed with water and is dried at 80° C. for 10 minutes to obtain a dry film having a thickness of 18 μm without any defects.

Thereafter, a negative pattern mask film is applied onto the photosensitive resist film to be vacuumed and exposed to actinic radiation at a dose of 300 mJ/cm² by use of an ultra-high pressure mercury lamp.

The above resist is then subjected to developing treatment with a 1% sodium carbonate solution at 25° C. for 40 seconds, followed by washing with water, and carrying out etching treatment with cupric chloride to obtain a pattern circuit.

The printed-circuit board thus obtained shows no pinholes after etching for its square plate of 10×10 cm along with a perfect formation of through-holes.

COMPARATIVE EXAMPLE 1

The procedures of Example 1 are repeated except that the copper-clad base plate is not subjected to the corrosion preventing treatment to obtain an electrodeposition-coated film having a thickness of 18 μm and having some pinholes in the corners of the through-holes.

The resulting film is subjected to developing and etching in the same manner as in Example 1 to obtain a pattern circuit.

The printed-circuit board thus obtained shows 5 pinholes and a partial etching deficiency in the corners of through-holes after etching for its square plate of 10×10 cm.

EXAMPLE 2

The procedures of Example 1 are repeated except that a 0.5% aqueous pyrazole solution is used in place of the 0.5% aqueous imidazole solution used as a corrosion inhibitor solution in Example 1 to obtain a printed-circuit board. The printed-circuit board thus obtained shows no pinholes after etching for its square plate of 10×10 cm.

COMPARATIVE EXAMPLE 2

The procedures of Example 2 are repeated except that the copper-clad base plate is not subjected to the corrosion preventing treatment to obtain a printed-circuit board, which shows 5 pinholes for its square plate of 10×10 cm after etching.

EXAMPLE 3

The procedures of Example 1 are repeated except that a 1% aqueous 5-pyrazolone solution is used in place of the 0.5% aqueous imidazole solution used as a corrosion inhibitor solution in Example 1 to obtain a printed-circuit board. The printed-circuit board thus obtained shows no pinholes after etching for its square plate of 10×10 cm.

COMPARATIVE EXAMPLE 3

The procedures of Example 3 are repeated except that the copper-clad base plate is not subjected to the corrosion preventing treatment to obtain a printed-circuit board, which shows 5 pinholes for its square plate of 10×10 cm after etching.

EXAMPLE 4

A mixture of 600 parts by weight of styrene, 100 parts by weight of methyl acrylate, 300 parts by weight of acrylic acid and 30 parts by weight of azobisisobutylonitrile is dropped over 3 hours into 900 parts by weight of cellosolve kept at 120° C. under an atmosphere of nitrogen gas. The completion of the above dropping is followed by one hour's maturing, and a mixture of 10 parts by weight of azobisdimethylvaleronitrile and 100 parts by weight of cellosolve is dropped over one hour, followed by 5 hours' maturing to obtain a solution of a high acid value acrylic resin having an acid value of 233. Thereafter, to the above solution are added 350 parts by weight of glycidyl methacrylate, 1.3 part by weight of hydroquinone and 6 parts by weight of tetraethylammonium bromide, followed by reacting for 5 hours at 110° C. blowing air thereinto to obtain a solution of an unsaturated resin having an acid value of 70 and a degree of unsaturation of 1.83 moles/kg.

To 2400 parts by weight of the unsaturated resin solution is added 85 parts by weight of triethylamine to be sufficiently neutralized. Thereafter, 400 parts by weight of isobutyl alcohol and 70 parts by weight of benzoin ethyl ether as the photopolymerization initiator are added, followed by adding deionized water in such an amount as to obtain an electrodeposition coating bath having a solids content of 13% by weight and a specific electric conductivity of 1,350 μs/cm. An electrodeposition coating is carried out under such conditions that a copper-clad laminated plate, the through-holes of which are plated and which is dipped into a 1% aqueous imidazole hydrochloric acid salt solution at room temperature for 30 seconds, followed by washing with water and drying to be used as an anode, and that a direct current is applied to be a predetermined value in 8 seconds in the above electrodeposition coating bath at a bath temperature of 30° C. under a current density of 50 mA/dm², followed by applying the current for 3 minutes and 40 seconds, washing with water a coated film, and drying at 90° C. for 10 minutes to obtain a resist film with no defects and having a thickness of 20 μm.

Thereafter, a negative pattern mask film is applied onto the resist film to be vacuumed and exposed to actinic radiation at a dose of 350 mj/cm² by use of a metal halide lamp.

The resulting plate is subjected to developing treatment with a 1% sodium carbonate solution for 50 seconds, followed by washing with water, and carrying out etching treatment with cupric chloride to obtain a pattern circuit with formed through-holes.

The printed-circuit board thus obtained shows no pinholes after etching for its square plate of 10×10 cm along with an excellent formation of through-holes.

COMPARATIVE EXAMPLE 4

The procedures of Example 4 are repeated except that the copper-clad laminated base plate is not subjected to the corrosion preventing treatment with the results that some small craters are developed in the resist film and that a 10×10 cm square plate of the printed-circuit board shows two pinholes and voids in the interior of through-holes.

EXAMPLE 5

Into a four-necked flask is introduced 400 parts of methylisobutyl ketone, followed by heating up to 80° C. with agitation, dropping over 3 hours a mixed solution of 240 parts of tert-butylaminoethyl methacrylate, 400 parts of methyl acrylate, 50 parts of acrylic acid and 35 parts of azobisisobutylonitrile, keeping for one hour, dropping over one hour a mixed solution of 80 parts of methylisobutyl ketone and 10 parts of azobisdimethylvaleronitrile, keeping for 2 hours, cooling down to 40° C., dropping over 2 hours a mixed solution of 270 parts of orthonaphthoquinonediazidosulfonic chloride and 630 parts of dioxane, and by keeping for 2 hours to obtain a positive type photosensitive resin.

Next, to the above photosensitive resin are added 200 parts of ethylene glycol monomethyl ether and 60 parts of dimethyl ethanol amine to be sufficiently neutralized, and followed by adding deionized water in such an amount as to obtain an electrodeposition coating bath (pH: 6.8) having a solids content of 12%. An electrodeposition coating is carried out under such conditions that a copper-clad laminated plate, the through-holes of which are plated and which is dipped into a 1% benzotriazole ethanol solution at room temperature for 30 seconds, followed by washing with water and drying to be used as an anode, and that a direct current is applied to be a predetermined value in 10 seconds in the above electrodeposition coating bath at a bath temperature of 23° C. under current density of 55 mA/dm$^2$, followed by applying the current for 2 minutes and 30 seconds, washing with water a coated film, and drying at 85° C. for 10 minutes to obtain a resist film with no defects and having a thickness of 8 μm.

Thereafter, a positive pattern mask film is applied onto the resist film to be vacuumed and exposed to actinic radiation at a dose of 300 mj/cm$^2$ by use of an ultra-high pressure mercury lamp.

The resulting plate is subjected to developing treatment with sodium metasilicate, followed by washing with water, and carrying out etching treatment with cupric chloride to obtain a pattern circuit.

The printed-circuit board thus obtained shows no pinholes after etching for its square plate of 10×10 cm.

COMPARATIVE EXAMPLE 5

The procedures of Example 5 are repeated except that the copper-clad laminated base plate is not subjected to the corrosion preventing treatment with the results that some small craters are developed in the corner area of the resist film and that a 10×10 cm square plate of the printed-circuit board shows two or more pinholes and a partial deficiency in the corner area of through-holes.

EXAMPLE 6

The procedures of Example 5 are repeated except that a 1% quinolinol ethanol solution is used in place of the 1% benzotriazole ethanol solution used as the corrosion inhibitor solution in Example 5 to obtain a pattern circuit. The printed-circuit board thus obtained shows no pinholes after etching for its square plate of 10×10 cm.

COMPARATIVE EXAMPLE 6

The procedures of Example 6 are repeated except that the copper-clad laminated base plate is not subjected to the corrosion preventing treatment with the results that a 10×10 cm square plate of the printed-circuit board shows two or more pinholes and a partial deficiency in the corner area of through-holes.

What is claimed is:

1. A process for preparing a printed circuit board, which comprises successive steps of subjecting a printed-circuit copper-clad, laminated base plate to a corrosion-preventing treatment after cladding or laminating, coating a photosensitive electrodeposition coating composition onto the resulting printed-circuit copper-clad, laminated base plate to form a photosensitive resist film, applying a pattern mask onto the photosensitive resist film, exposing the photosensitive resist film through the pattern mask to an actinic ray, developing the resulting photosensitive resist film, etching away a deposited copper foil in the non-circuit area and removing the resulting film on the circuit pattern, said corrosion-preventing treatment being carried out by a process which comprises contacting the printed-circuit copper-clad, laminated base plate with at least one nitrogen-containing heterocyclic compound selected from a group consisting of the compounds represented by the following general formulas (A) to (D):

wherein R$_1$ and R$_2$ each represents a hydrogen atom or an alkyl group having 1 to 6 carbon atoms;

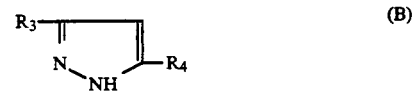

wherein R$_3$ and R$_4$ each represents hydrogen atom, a hydroxyl group or an alkyl group having 1 to 6 carbon atoms;

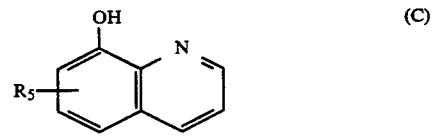

wherein R$_5$ represents a hydrogen atom, a chlorine atom or an alkyl group having 1 to 6 carbon atoms; and

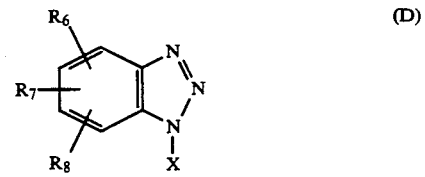

wherein X represents a hydrogen atom or a hydroxyl group, and R$_6$, R$_7$ and R$_8$ each represents a hydrogen atom, a chlorine atom or an alkyl group having 1 to 6 carbon atoms.

2. A process as claimed in claim 1 wherein said at least one compound of the general formula (A) is selected from a group consisting of imidazole, 2- methylimidazole, 2-ethylimidazole, 4-methylimidazole and 2-ethyl-4-methylimidazole.

3. A process as claimed in claim 1 wherein said at least on compound of the general formula (B) is selected from a group consisting of pyrazole, 5-oxypyrazole, pyrazolone, 3-methylpyrazole, 5-methylpyrazole, 3,5-dimethylpyrazole and 3-methyl-5-oxypyrazole.

4. A process as claimed in claim 1 wherein said at least one compound of the general formula (C) is selected from a group consisting of 3-quinolinol, 5-chloro-8-quinolinol, 5-methyl-8-quinolinol and 7-ethyl-8-quinolinol.

5. A process as claimed in claim 1 wherein said at least one compound of the general formula (D) is selected from a group consisting of benzotriazole, 1-hydroxybenzotriazole, 5,6-dimethylbenzotriazole and 5-chlorobenzotriazole.

6. A process as claimed in claim 1 wherein said at least one nitrogen-containing heterocyclic compound is used in the form of its salt with an inorganic or organic acid.

7. A process as claimed in claim 1 wherein the corrosion preventing treatment is carried out by a process which comprises dipping the base plate immediately after cladding or after laminating into an aqueous solution or an organic solvent solution containing said at least one nitrogen-containing heterocyclic compound.

8. A process as claimed in claim 7 wherein the concentration of said at least one nitrogen-containing heterocyclic compound in the solution is in the range of 0.01 to 10 percent by weight.

9. A process as claimed in claim 1 wherein the corrosion preventing treatment is carried out by a process which comprises coating a solution of said at least one nitrogen-containing heterocyclic compound onto the base plate.

10. A process as claimed in claim 9 wherein the concentration of said at least one nitrogen-containing heterocyclic compound in the solution in the range of 0.01 to 10 percent by weight.

* * * * *